US011658276B2

(12) United States Patent  (10) Patent No.: US 11,658,276 B2
Huang et al.  (45) Date of Patent: May 23, 2023

(54) ELECTRONIC DEVICE

(71) Applicant: InnoLux Corporation, Miao-Li County (TW)

(72) Inventors: Wan-Ling Huang, Miao-Li County (TW); Shu-Ming Kuo, Miao-Li County (TW); Tsau-Hua Hsieh, Miao-Li County (TW); Tzu-Min Yan, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 145 days.

(21) Appl. No.: 17/110,305

(22) Filed: Dec. 3, 2020

(65) Prior Publication Data
US 2021/0193892 A1    Jun. 24, 2021

(30) Foreign Application Priority Data

Dec. 24, 2019  (CN) .......................... 201911346314.6

(51) Int. Cl.
*H01L 33/62* (2010.01)
*H01L 33/52* (2010.01)
*H01L 33/50* (2010.01)

(52) U.S. Cl.
CPC .............. *H01L 33/62* (2013.01); *H01L 33/50* (2013.01); *H01L 33/52* (2013.01)

(58) Field of Classification Search
CPC combination set(s) only.
See application file for complete search history.

(56) References Cited

U.S. PATENT DOCUMENTS

| 8,410,504 | B2* | 4/2013 | Van Sprang | H01L 33/44 |
| | | | | 257/E33.072 |
| 2004/0046184 | A1* | 3/2004 | Yanagawa | H01L 51/525 |
| | | | | 257/200 |
| 2012/0044667 | A1* | 2/2012 | Hanawa | H01L 33/46 |
| | | | | 313/512 |
| 2012/0104445 | A1* | 5/2012 | Yang | H01L 33/60 |
| | | | | 438/33 |
| 2013/0037804 | A1 | 2/2013 | Lee | |
| 2015/0129902 | A1* | 5/2015 | Iino | H01L 33/46 |
| | | | | 257/98 |
| 2015/0349225 | A1* | 12/2015 | Oh | H01L 24/14 |
| | | | | 257/99 |
| 2016/0179453 | A1* | 6/2016 | Jepsen | G06F 3/1446 |
| | | | | 345/1.3 |
| 2017/0088747 | A1 | 3/2017 | Huang | |
| 2021/0159208 | A1* | 5/2021 | Wang | H01L 25/18 |
| 2021/0265317 | A1* | 8/2021 | Leirer | H01L 25/0753 |

* cited by examiner

Primary Examiner — Mark W Tornow
Assistant Examiner — Priya M Rampersaud
(74) Attorney, Agent, or Firm — Winston Hsu (57) ABSTRACT

An electronic device including a light emitting element, a wavelength conversion layer, a conductive wire and a wavelength selection layer is provided by the present disclosure. The light emitting element is configured to emit a light. The wavelength conversion layer is configured to convert the light. The conductive wire is electrically connected to the light emitting element. The wavelength selection layer is disposed between the conductive wire and the wavelength conversion layer, wherein the conductive wire is cured by an energy beam, and the wavelength selection layer is configured to block the energy beam.

18 Claims, 11 Drawing Sheets

ELECTRONIC DEVICE

BACKGROUND OF THE DISCLOSURE

1. Field of the Disclosure

The present disclosure relates to an electronic device having a wavelength selection layer.

2. Description of the Prior Art

Nowadays, common electronic devices usually provide information to users through a display device. Currently, the industry is still committed to improving the reliability or display quality of electronic devices.

SUMMARY OF THE DISCLOSURE

According to some embodiments of the present disclosure, an electronic device comprising a light emitting element, a wavelength conversion layer, a conductive wire and a wavelength selection layer is provided. The light emitting element is configured to emit a light. The wavelength conversion layer is configured to convert the light. The conductive wire is electrically connected to the light emitting element. The wavelength selection layer is disposed between the conductive wire and the wavelength conversion layer, wherein the conductive wire is cured by an energy beam, and the wavelength selection layer is configured to block the energy beam.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "include" and "comprise" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

The electrical connection can be a direct connection or an indirect connection. The electrical connection between two components can be a direct contact to transmit electrical signals, and there are no other components between them. The electrical connection between two components can be achieved by bridging through the component intermediate between the two components to transmit electrical signals. The electrical connection can also be referred to as coupling.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

The electronic device of the present disclosure may include a display device, antenna, touch electronic device, curved electronic device or free shape electronic device, but not limited thereto. The electronic device may be a foldable electronic device or a flexible electronic device. The electronic device may for example include a light emitting diode, a liquid crystal, a fluorescence, a phosphor, other suitable display medium or the combinations thereof, but not limited thereto. The light emitting diode may for example include organic light emitting diode (OLED), inorganic light emitting diode (LED), mini light-emitting diode (mini LED), micro light-emitting diode (micro-LED), quantum dots light emitting diode (QLED), other suitable materials or the combinations of the above-mentioned materials, but not limited thereto. The display device may for example include a tiled display device, but not limited thereto. The concepts or theorem of the present disclosure may be applied to a liquid crystal display (LCD) device which is non-self-luminous, but not limited thereto.

The antenna may be a liquid crystal antenna or other types of antenna, but not limited thereto. The antenna may for example include a tiled antenna, but not limited thereto. It should be noted that the electronic device may be any combination of the above-mentioned devices, but not limited thereto. In addition, the shape of the electronic device may be a rectangular shape, a circular shape, a polygonal shape, a shape with curved edges or other suitable shapes. The electronic device may include peripheral systems such as a driving system, a controlling system, a light source system and a shelf system to support the display device, the antenna or the tiled device. In the following, a display device will be regarded as an electronic device to illustrate the content of the present disclosure, but the present disclosure is not limited thereto.

The display device may include a plurality of sub-pixels arranged side-by-side with each other. The sub-pixels may for example include a light emitting element, a color filter and/or a circuit layer corresponding to the light emitting element or other layers corresponding to the light emitting element, but not limited thereto. In an embodiment, different sub-pixels may emit light with different colors, such as a green light, a red light, a blue light, a yellow light or a white light, but not limited thereto. The color of the light emitted from the sub-pixel may be designed according to the demands. In another embodiment, the display device may be a monochrome display device, and all of the sub-pixels may emit light with a single color, such as white, red or other suitable colors. In addition, the shape of the sub-pixels in a top view may be a rectangular shape, a parallelogram, a ">" shape or other suitable shapes. It should be noted that the electronic device may be any combination of the devices mentioned above, but not limited thereto.

Figure 1:
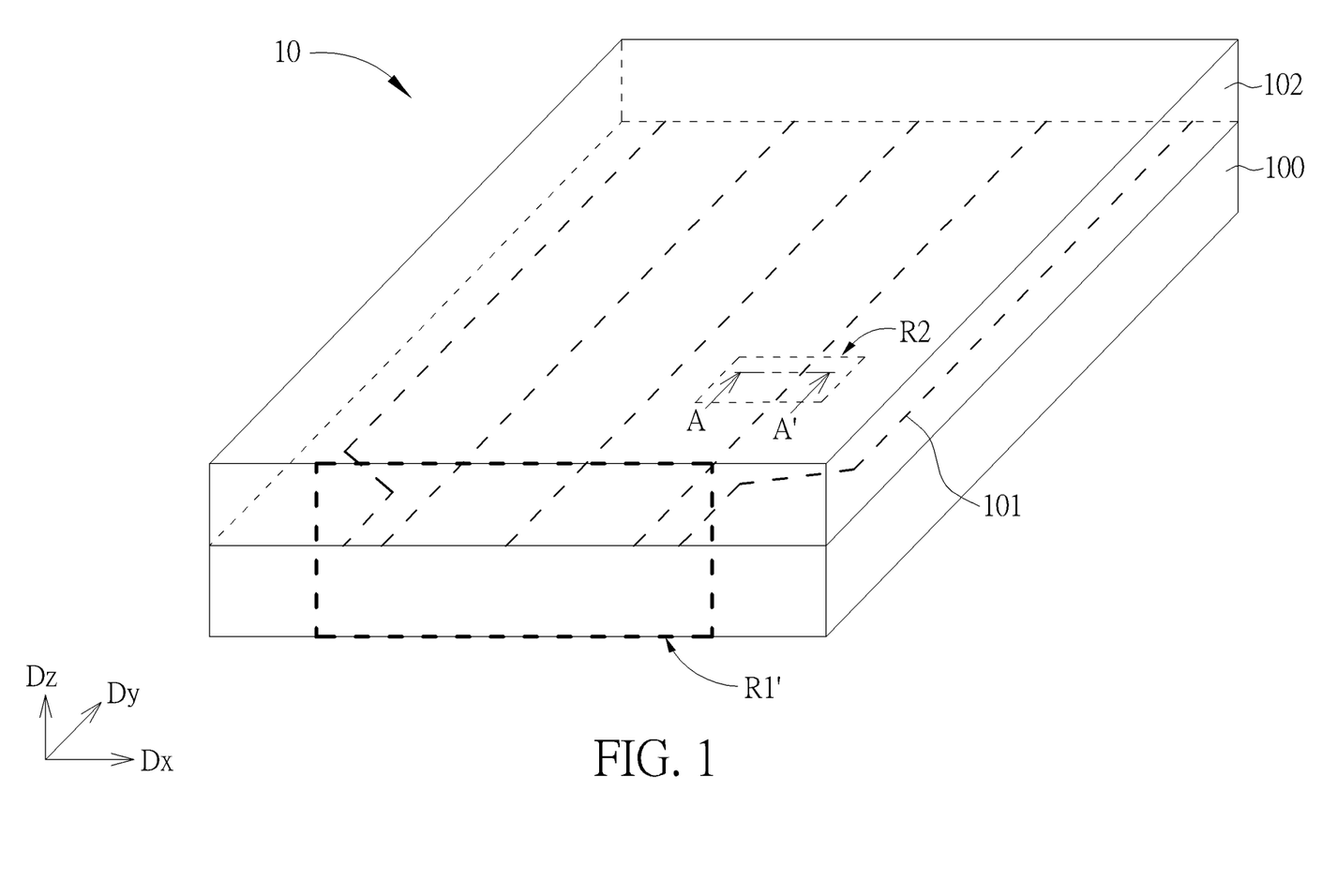
FIG. 1 schematically illustrates an electronic device according to a first embodiment of the present disclosure.

Referring to FIG. 1, FIG. 1 schematically illustrates an electronic device according to a first embodiment of the present disclosure. The structure shown in FIG. 1 may for example be an electronic device 10 (or a display device), a substrate 100 (or called as a first substrate), a substrate 102 (or called as a second substrate) and a plurality of signal lines 101 are drawn in FIG. 1, and other elements are omitted. The configuration of the signal lines 101 shown in FIG. 1 is only illustrative, and may be adjusted according to the demands of design. In the following figures, other elements of the electronic device 10 may be described in detail. The signal lines 101 may be disposed on the substrate 100, and may be disposed between the substrate 100 and the substrate 102, but not limited thereto. In some embodiments, the substrate 102 may be replaced with an encapsulation layer, but not limited thereto. In some embodiments, the signal lines 101 may for example be data lines, but not limited thereto. For example, the signal lines 101 may extend to a region R1' close to the edge of the electronic device 10, and may be electrically connected to components such as the driving element or the conductive pad through the conductive wires 106 (shown in FIG. 2), but not limited thereto.

A direction Dx, a direction Dy and a direction Dz is labeled in FIG. 1. The direction Dz is perpendicular to the upper surface or the lower surface of the substrate 100 or the substrate 102, the direction Dx and the direction Dy may be parallel to the upper surface or the lower surface of the substrate 100 or the substrate 102. The direction Dz may be perpendicular to the direction Dx and the direction Dy, and the direction Dx may be perpendicular to the direction Dy. In the following figures, the spatial relationship in the structure may be described according to the direction Dx, the direction Dy and the direction Dz.

Figure 2:
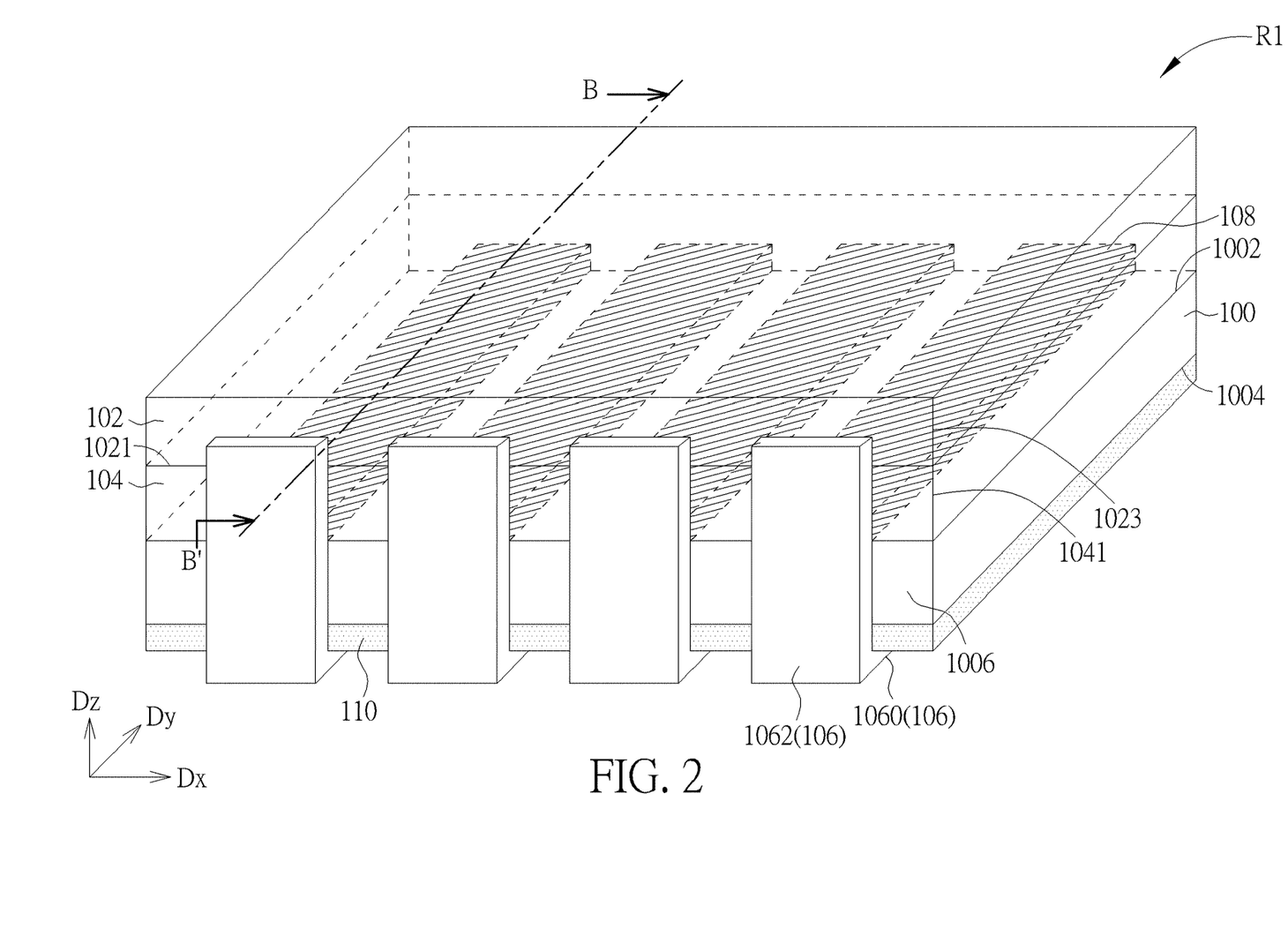
FIG. 2 schematically illustrates an enlarged view of a first example of a region R1 where a region R1' shown in FIG. 1 is partially extended along a direction Dy.
Figure 3:
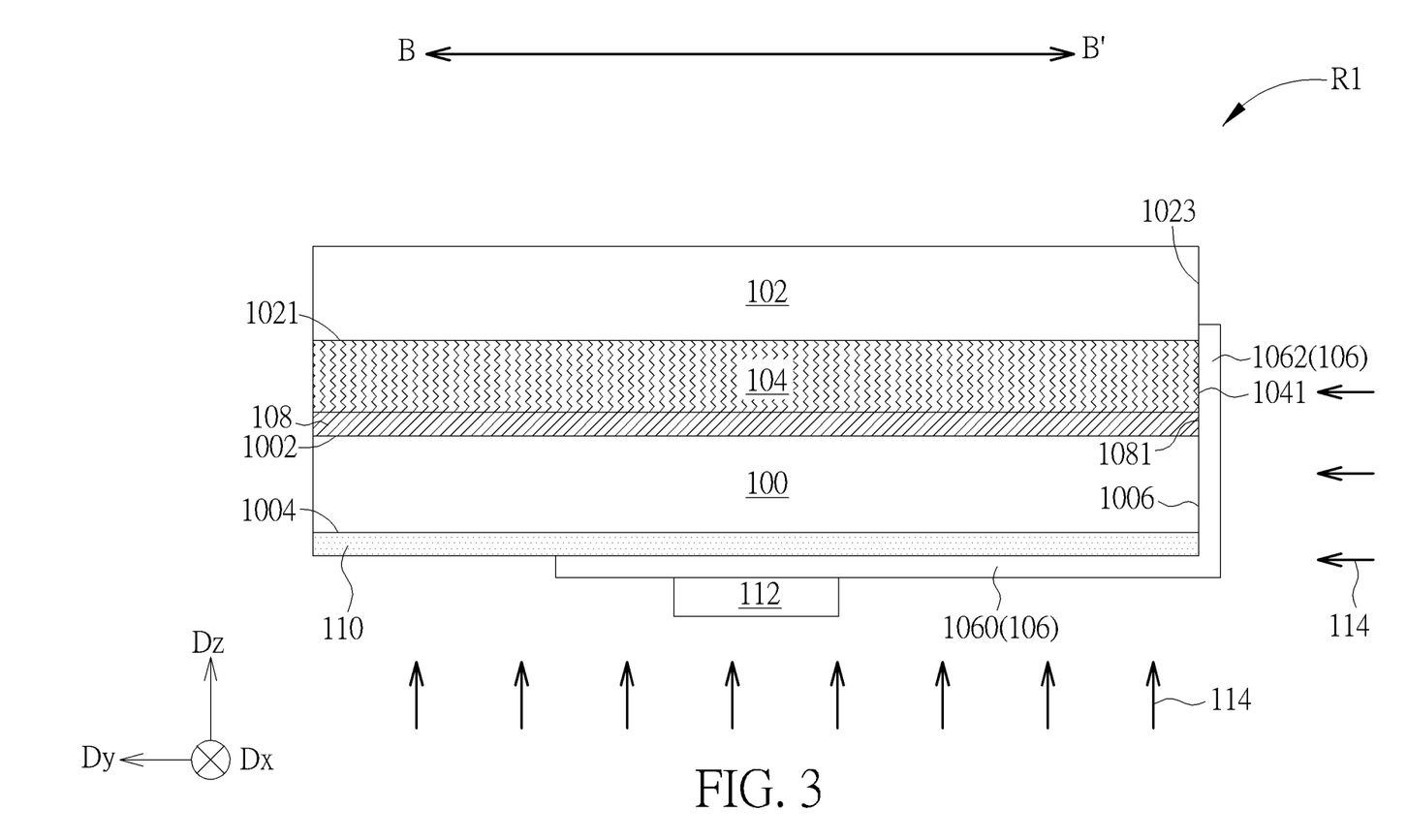
FIG. 3 schematically illustrates a cross-sectional view of a structure shown in FIG. 2 along a line B-B'.

Referring to FIG. 2 and FIG. 3, FIG. 2 schematically illustrates an enlarged view of a first example of a region R1 where a region R1' shown in FIG. 1 is partially extended along a direction Dy, FIG. 3 schematically illustrates a cross-sectional view of a structure shown in FIG. 2 along a line B-B'. The structures shown in FIG. 2 and FIG. 3 may for example be a portion of the structure of the electronic device 10 (or display device) close to the edge of the substrate 100, but not limited thereto. Only a portion of the electronic device 10 is drawn in FIG. 2 and FIG. 3 as an example. In some embodiments, a plurality of electronic devices 10 may be connected to each other to form a tiled device, but not limited thereto. In some other embodiments, the electronic device 10 may include an independent display device instead of being a tiled display device, but not limited thereto. In the following, the electronic device 10 shown in FIG. 1 will be used as an example for description.

As shown in FIG. 2 and FIG. 3, the electronic device 10 may include a substrate 100, a substrate 102, an adhesive layer 104, a plurality of conductive wires 106, a plurality of conductive pads 108 and a wavelength selection layer 110, but not limited thereto. In some embodiments, the substrate 102 and the adhesive layer 104 may be optionally disposed, but not limited thereto. The substrate 100 may be disposed opposite to the substrate 102, and the adhesive layer 104 may be disposed between the substrate 100 and the substrate 102. The materials of the substrate 100 and the substrate 102 may include glass, quartz, sapphire, polymer (such as polyimide (PI) and polyethylene terephthalate (PET)) and/or other suitable materials, such that the substrate 100 and the substrate 102 may be a flexible substrate or a rigid substrate, but not limited thereto. The substrate 100 and the substrate 102 may include the same material or include different materials. The adhesive layer 104 may for example include optical clear resin (OCR), but not limited thereto.

The substrate 100 may include a surface 1002 (or called as a first surface) and a surface 1004 (or called as a second surface) opposite to the surface 1002, wherein the surface 1002 may be closer to the substrate 102, and the surface 1004 may be farther away from the substrate 102. In addition, the substrate 100 may include a side surface 1006, the side surface 1006 may substantially be parallel to the direction Dz, the side surface 1006 may be located between the surface 1002 and the surface 1004, and the side surface 1006 may connect the surface 1002 and the surface 1004. Taking a conductive wire 106 shown in FIG. 2 and FIG. 3 as an example, a portion 1060 of the conductive wire 106 may be disposed on the surface 1004, and a portion 1062 of the conductive wire 106 may be disposed on the side surface 1006. The conductive wires may for example be a conductive material that connects the driving element and the conductive pad or a conductive material that connects the driving element and the circuit layer (not shown) in the display region. In some embodiments, at least a portion of the conductive wire is not located between the substrate 100 and the substrate 102. In some embodiments, a portion of the conductive wire is disposed on the side surface 1006 of the substrate 100 or on the outer surface (such as the surface 1004) of the substrate 100.

The conductive wires 106 may be formed on the surface 1004 and the side surface 1006 of the substrate 100 through a printing process, but not limited thereto. The conductive wires 106 may be cured by an energy beam 114 to improve its conductive characteristics. The material of the conductive wires 106 may include conductive glue, but not limited thereto. The conductive glue may include glue, colloid, paint or ink containing conductive components (such as metal or carbon), but not limited thereto. The metal or carbon of the conductive component may include micro-scale debris or nanoparticles in specific, unspecified or mixed morphology, but not limited thereto. The metal may include silver particles, copper particles or other metal materials, but not limited thereto. The energy beam 114 may irradiate at least a portion of the surface 1004 of the substrate 100 provided with the conductive wires 106 and/or a portion of the side surface 1006 of the substrate 100 provided with the conductive wires 106, but not limited thereto. In some embodiments, the conductive wires 106 may be formed on the surface 1004 and the side surface 1006 of the substrate 100 through a deposition or a sputtering process, but not limited thereto. The term "cured" mentioned in the present disclosure may represent that a liquid material is cured by irradiating the energy beam.

In addition, the energy beam 114 may include a laser or an impulse lamp, but not limited thereto. For example, the energy beam 114 may include an ultraviolet laser (wavelength may be less than 400 nanometers (nm)), a visible laser (wavelength may range from 400 nm to 750 nm) or an infrared laser (wavelength may be greater than 750 nm), but not limited thereto. The impulse lamp may for example include a pulsed xenon lamp, but not limited thereto. As shown in FIG. 2, the energy beam 114 of the present embodiment may be applied to the surface 1004 and the side surface 1006 of the substrate 100, but not limited thereto.

As shown in FIG. 2 and FIG. 3, the conductive pads 108 may be disposed between the substrate 100 and the substrate 102. In some embodiments, the conductive pads 108 may be disposed on the surface 1002 of the substrate 100. For example, the conductive pads 108 may be disposed between the adhesive layer 104 and the substrate 100, but not limited thereto. In some embodiments, the conductive pad 108 may be in contact with a portion 1062 of the conductive wire 106 to be electrically connected to the conductive wires 106, but not limited thereto. As shown in FIG. 3, the conductive pad 108 can include a side surface 1081 substantially parallel to the direction Dz. In some embodiments, the portion 1062 of the conductive wire 106 may be extended from the side surface 1006 of the substrate 100 to the side surface 1081 of the conductive pad 108, such that the portion 1062 of the conductive wire 106 may be electrically connected to at least a portion of the side surface 1081 of the conductive pad 108. In some embodiments, the portion 1062 of the conductive wire 106 may be extended from the side surface 1006 of the substrate 100 to the side surface 1081 of the conductive pad 108 and at least a portion of a side surface 1041 of the adhesive layer 104, wherein the side surface 1041 of the adhesive layer 104 may be substantially parallel to the direction Dz. In some embodiments, the portion 1062 of the conductive wire 106 may be extended from the side surface 1006 of the substrate 100 to the side surface 1081 of the conductive pad 108, the side surface 1041 of the adhesive layer 104 and at least a portion of a side surface 1023 of the substrate 102, wherein the side surface 1023 of the substrate 102 may be substantially parallel to the direction Dz. In some embodiments, the side surface 1006 of the substrate 100, the side surface 1081 of the conductive pad 108, the side surface 1041 of the adhesive layer 104 and the side surface 1023 of the substrate 102 may be aligned with each other, but not limited thereto.

For example, the conductive pads 108 may be electrically connected to the light emitting elements in the display region, such that the conductive wires 106 may be electrically connected to the light emitting elements through the conductive pads 108, but not limited thereto. In addition, the conductive pads 108 may be electrically connected to other signal lines or other elements of the electronic device 10 according to the demands of the design.

In some embodiments, the conductive pads 108 may include a metal conductive material, a transparent conductive material or the combinations of the above-mentioned materials. In some embodiments, the above-mentioned metal conductive material may include copper, aluminum, molybdenum, silver, tin, tungsten, gold, chromium, nickel, platinum, copper alloy, aluminum alloy, molybdenum alloy, silver alloy, tin alloy, tungsten alloy, gold alloy, chromium alloy, nickel alloy, platinum alloy, other suitable metal materials or the combinations of the above-mentioned materials, but not limited thereto. In some embodiments, the above-mentioned transparent conductive material may include transparent conductive oxide (TCO). For example, the transparent conductive oxide may include indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), other suitable transparent conductive materials or the combinations of the above-mentioned materials, but not limited thereto.

In addition, the conductive wires 106 (such as a portion 1060 of the conductive wire 106 disposed on the surface 1004) may for example be electrically connected to an integrated circuit 112. Therefore, the conductive wires 106 may transmit the signals from the integrated circuit 112 to the elements of the electronic device 10 through the conductive pads 108. The integrated circuit 112 may be disposed on the surface 1004 of the substrate 100. The integrated circuit 112 may include at least one thin film transistor to drive the elements of the electronic device 10, but not limited thereto. In some embodiments, the integrated circuit 112 may be directly disposed on the substrate 100 or a flexible printed circuit board (not shown), but not limited thereto. In some embodiments, the integrated circuit 112 may be electrically connected to the conductive wires 106 through the flexible printed circuit board, but not limited thereto.

As shown in FIG. 3, the wavelength selection layer 110 may be disposed between the conductive wires 106 (such as the portion 1060 of the conductive wire 106) and the substrate 100 (such as the surface 1004 of the substrate 100). The wavelength selection layer 110 may be used to block the energy beam 114 to reduce the deterioration of the components or materials of the electronic device 10 affected by the energy beam 114, thereby improving reliability or display quality of the electronic device 10. For example, the wavelength selection layer 110 used in the electronic device 10 may block the energy beam 114. The blocking effect of the wavelength selection layer 110 in this disclosure is defined as being able to suppress the transmittance of the energy beam 114 to less than 10%. The "transmittance" described in the present disclosure may be the value obtained by dividing the integral value of the spectrum of the energy beam (such as the laser) passing through the wavelength selection layer by the integral value of the spectrum of the energy beam before passing through the wavelength selection layer and multiplying by 100%.

For example, the material of the wavelength selection layer 110 may include silver, gold, copper, aluminum, chromium, platinum, other suitable metals, alloys or metal oxides of the above-mentioned metals or the combinations of the above-mentioned materials, but not limited thereto. In addition, the wavelength selection layer 110 may include single layer or multiple layers, but not limited thereto.

In some embodiments, the wavelength selection layer 110 may adopt a metal material layer including silver, gold, copper, aluminum, chromium, platinum, etc., or alloys or metal oxides of the above-mentioned materials, or a multi-layer film including the above-mentioned materials, but not limited thereto. Different types of metal may be used to reflect the energy beams 114 with different wavelength ranges. For example, the metal material layer including aluminum may have high reflectivity for the wavelength band from ultraviolet light to infrared light, and the metal material layer including gold may be suitable for reflecting the infrared wave band.

In some embodiments, the wavelength selection layer 110 may include an infrared light absorber if the wave band of the infrared light is taken as an example. For example, the infrared light absorber may include poly aromatic hydrocarbons, conjugated multi-enes, special core-shell structure or material quantum dots or multi-layer film, but not limited thereto.

In some embodiments, the wavelength selection layer 110 may adopt a multi-layer film if the wave band of the infrared light is taken as an example. For example, the multi-layer film may include a multi-layer stacked structure of metal films, metal oxide films or complex metal oxide films, but not limited thereto. At least two different refractive indices may be included in the multi-layer film, when the energy beam 114 enters the film, the traveling direction of the energy beam 114 may be changed, or it can be totally reflected before entering the film by matching the refractive indices of different layers of the film, thereby achieving the effect of blocking the energy beam 114. In addition, the wavelength selection layer mentioned above may be used to block the energy beam of other wave bands.

In some embodiments, the function and/or the material of the wavelength selection layer mentioned above may be adopted independently, or may be the combinations of any two of them or three of them.

Figure 4:
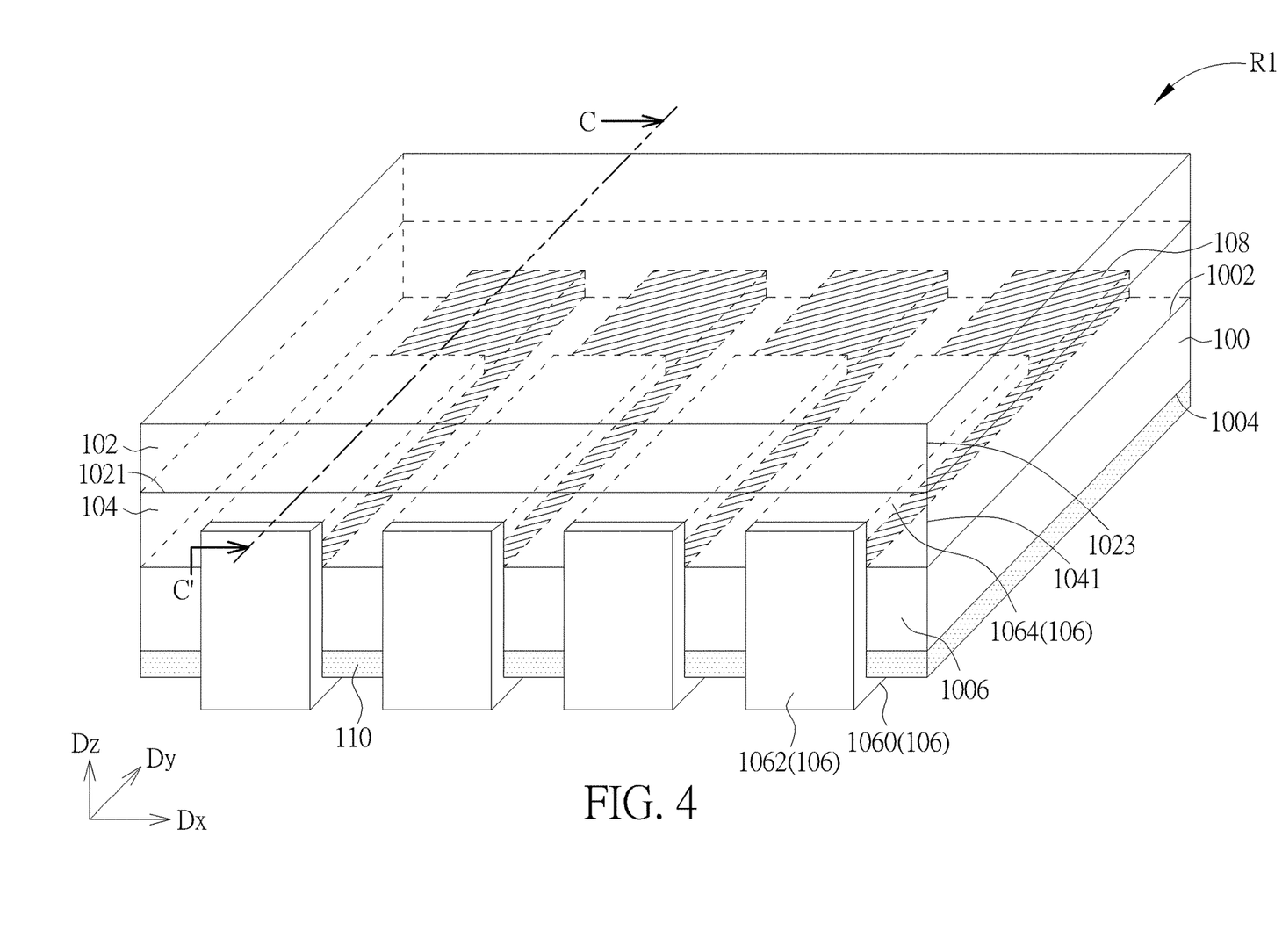
FIG. 4 schematically illustrates an enlarged view of a second example of a region R1 where a region R1' shown in FIG. 1 is partially extended along a direction Dy.
Figure 5:
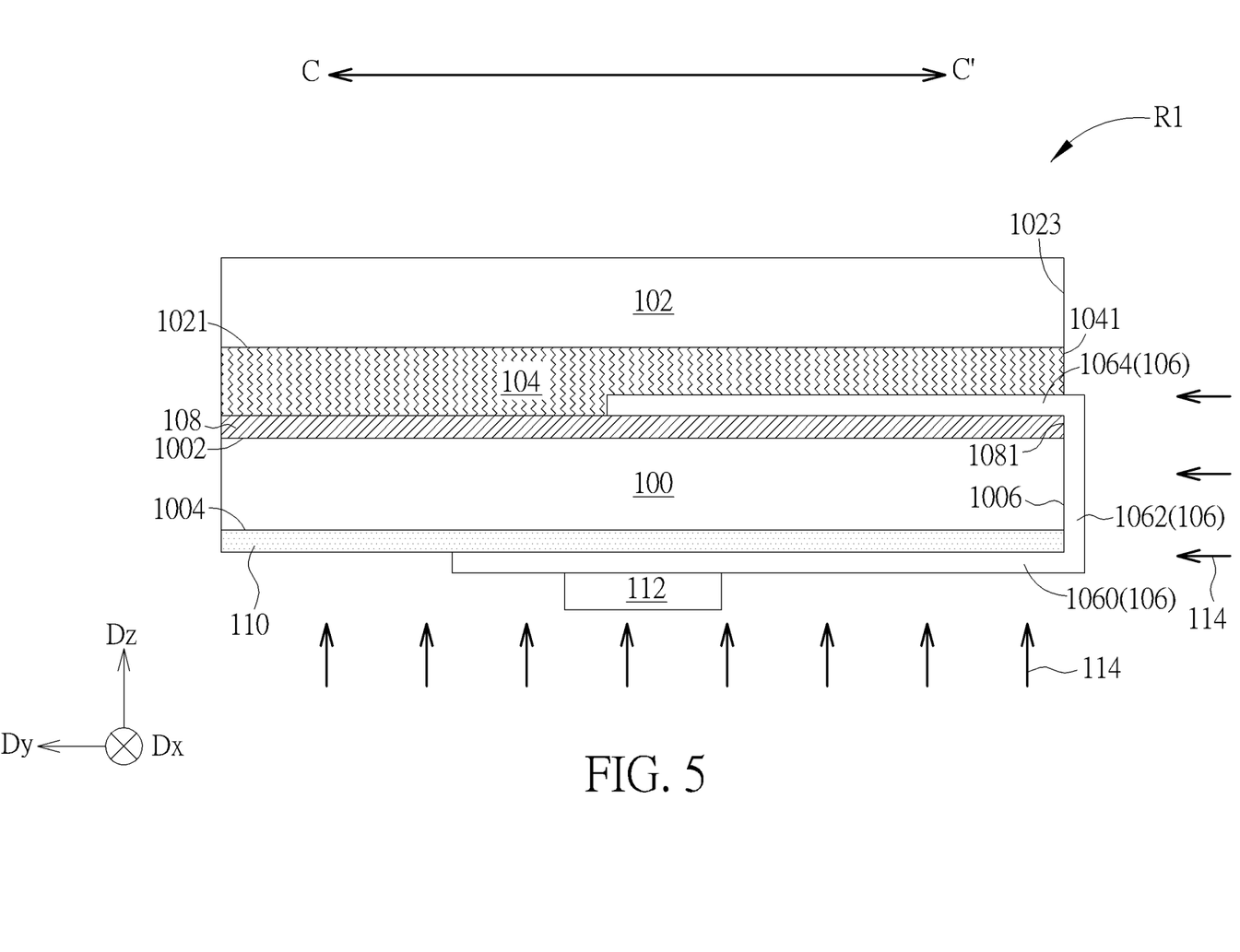
FIG. 5 schematically illustrates a cross-sectional view of a structure shown in FIG. 4 along a line C-C'.

Referring to FIG. 4 and FIG. 5, FIG. 4 schematically illustrates an enlarged view of a second example of a region R1 where a region R1 shown in FIG. 1 is partially extended along a direction Dy, and FIG. 5 schematically illustrates a cross-sectional view of a structure shown in FIG. 4 along a line C-C'. The difference between the first example and the second example is that the conductive wire 106 may further include a portion 1064, and the portion 1064 of the conductive wire 106 may be disposed between the substrate 100 and the substrate 102, but not limited thereto. In some embodiments, the portion 1064 of the conductive wire 106 may be disposed between the conductive pad 108 and the adhesive layer 104, but not limited thereto. In some embodiments, the conductive pad 108 may be in contact with the portion 1064 of the conductive wire 106 to be electrically connected to the conductive wire 106, but not limited thereto. In other words, the portion 1064 of the conductive wire 106 may be extended from between the substrate 100 and the substrate 102 of the electronic device 10 to the side surface 1006 of the substrate 100, the portion 1062 of the conductive wire 106 may successively extend along the side surface 1006 and toward the surface 1004, the portion 1060 of the conductive wire 106 may continually extend on the surface 1004, and the integrated circuit 112 may be disposed on the portion 1060 of the conductive wire 106, but not limited thereto.

Figure 6:
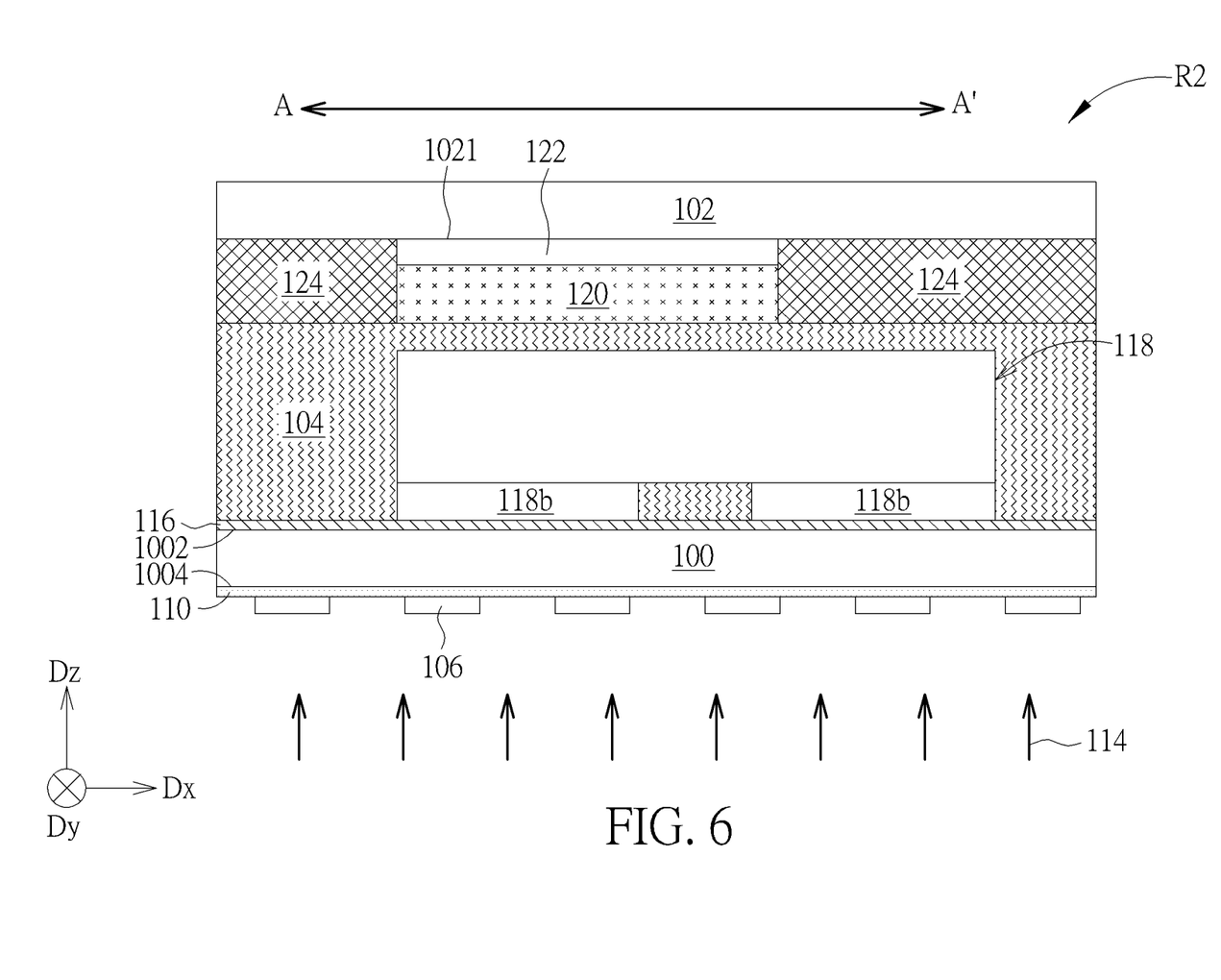
FIG. 6 schematically illustrates a cross-sectional view of a region R2 shown in FIG. 1 along a line A-A'.

Referring to FIG. 6, FIG. 6 schematically illustrates a cross-sectional view of a region R2 shown in FIG. 1 along a line A-A'. The structure shown in FIG. 6 may for example be a structure of a region R2 in the display region of the electronic device 10 (or display device) shown in FIG. 1, and may for example be a cross-sectional structure corresponding to a light emitting element, but not limited thereto. As shown in FIG. 6, the electronic device 10 may further include a circuit layer 116, at least one light emitting element 118, at least one wavelength conversion layer 120, at least one color filter 122 and a black matrix layer 124, but not limited thereto. The circuit layer 116 may be disposed on the surface 1002 of the substrate 100. The circuit layer 116 may include elements such as thin film transistor, capacitor, and/or signal lines 101 shown in FIG. 1, etc., but not limited thereto. In some embodiments, the circuit layer 116 may be electrically connected to at least a portion of the conductive pads 108 shown in FIG. 2 to FIG. 5, or the signal lines 101 in the circuit layer 116 may be electrically connected to at least a portion of the conductive pads 108, but not limited thereto. The light emitting element 118 may be disposed on the surface 1002 of the substrate 100. In an embodiment, the circuit layer 116 may be disposed between the light emitting element 118 and the substrate 100. In the present embodiment, the light emitting element 118 may be disposed between the substrate 100 and the substrate 102, and the light emitting element 118 may be covered by the adhesive layer 104, but not limited thereto.

The light emitting element 118 may be used for emitting a light, for example, the light emitting element 118 may emit a blue light or an ultraviolet light, but not limited thereto. The light emitting element 118 may include a light emitting diode, but not limited thereto. For example, the light emitting element 118 may include a micro LED, a mini LED, a quantum dot LED, a nanowire LED or a bar type LED, but not limited thereto.

The light emitting element 118 may for example be electrically connected to the thin film transistor or the signal line 101 of the circuit layer 116. For example, the light emitting element 118 may include at least one bonding pad 118b, and the bonding pad 118b may be bonded to another bonding pad (not shown) of the circuit layer 116 to be electrically connected to the thin film transistor or the signal line 101 of the circuit layer 116, but not limited thereto. The bonding pad 118b of the light emitting element 118 and another bonding pad of the circuit layer 116 may include metal or other suitable conductive materials, but not limited thereto. In addition, as shown in FIG. 3 or FIG. 5, the conductive wire 106 may be disposed on the surface 1004 of the substrate 100, and the conductive wire 106 may be electrically connected to the circuit layer 116 through the conductive pad 108, such that the integrated circuit 112 may control the light emitting element 118 through the conductive wire 106. In other words, the conductive wire 106 may be electrically connected to the light emitting element 118 and/or used to drive the light emitting element 118, but not limited thereto. In addition, the material of the adhesive layer 104 may be filled into the gap between the bonding pads 118b in some embodiments, such that the influence of moisture or oxygen on the light emitting element 118 may be reduced, or the adhesion between the light emitting element 118 and the circuit layer 116 may be improved. The gap between the bonding pads 118 may be filled with other materials, the materials may for example be a glue or photoresist polymer materials such as acrylic resin, epoxy resin, phenolic resin, etc., but not limited thereto.

The wavelength conversion layer 120, the color filter 122 or the black matrix layer 124 may be optionally disposed on the light emitting element 118, or may be optionally disposed on a surface 1021 of the substrate 102, or may be optionally disposed between the substrate 102 and the adhesive layer 104, but not limited thereto. In some embodiments, a light scattering layer (not shown) may be disposed on the light emitting element 118, but not limited thereto. The wavelength conversion layer 120 may be used to convert the light emitted by the light emitting element 118 (for example, convert the wavelength of the light). For example, the wavelength conversion layer 120 may convert the light emitted by the light emitting element 118 to a red light, a green light or a blue light, but not limited thereto. For example, the wavelength conversion layer 120 may include a quantum dot material, a phosphor, a fluorescence or the combinations of the above-mentioned materials, but not limited thereto.

The color filter 122 may be disposed on the wavelength conversion layer 120 or disposed between the substrate 102 and the wavelength conversion layer 120, but not limited thereto. The color filter 122 may include red organic material, green organic material or blue organic material, but not limited thereto. For example, in a red sub-pixel, the wavelength conversion layer 120 may include a quantum dot material capable of converting the light emitted by the light emitting element 118 to a red light, and the color filter 122 may be a red color filter, but not limited thereto.

The black matrix layer 124 may include light blocking materials such as black organic material or black photoresist, but not limited thereto. As shown in FIG. 6, the wavelength conversion layer 120 and the color filter 122 may be disposed between the adjacent black matrix layers 124. For example, the black matrix layer 124 may adopt a material that can facilitate the coating of the quantum dot material in the wavelength conversion layer 120. In addition, the black matrix layer 124 may include a single layer structure or a multi-layers structure. In the multi-layers structure, different layers may include the same material or different materials. In another aspect, the black matrix layer 124 may be disposed between the wavelength conversion layers 120 (or the color filters 122) of adjacent sub-pixels to reduce the interference of the lights of the adjacent sub-pixels.

In some embodiments, the wavelength selection layer 110 may be disposed between the conductive wire 106 and the wavelength conversion layer 120, for example, the wavelength selection layer 110 may be disposed between the conductive wire 106 and the substrate 100, but not limited thereto. Because the conductive wire 106 may be cured through the energy beam 114, and the material (such as the quantum dot) in the wavelength conversion layer 120 may be easily affected by the energy beam 114, the wavelength selection layer 110 may be used to block the energy beam 114 to protect the material in the wavelength conversion layer 120 by disposing the wavelength selection layer 110 between the conductive wire 106 and the wavelength conversion layer 120, thereby improving stability or display quality of the electronic device 10. In some embodiments, the wavelength selection layer 110 may be disposed between the energy beam 114 and the wavelength conversion layer 120, and the wavelength selection layer 110 may be patterned to include a plurality of patterns, each of the patterns may respectively correspond to a region of the wavelength conversion layer 120, that is, the wavelength selection layer 110 may respectively correspond to a light emitting element 118.

Other embodiments of the present disclosure will be described in the following. In order to simplify the description, the same elements in the following would be labeled with the same symbol. In order to emphasize the differences between the embodiments, the differences between the embodiments will be described in detail in the following contents, and the repeated features will not be redundantly described.

Figure 7:
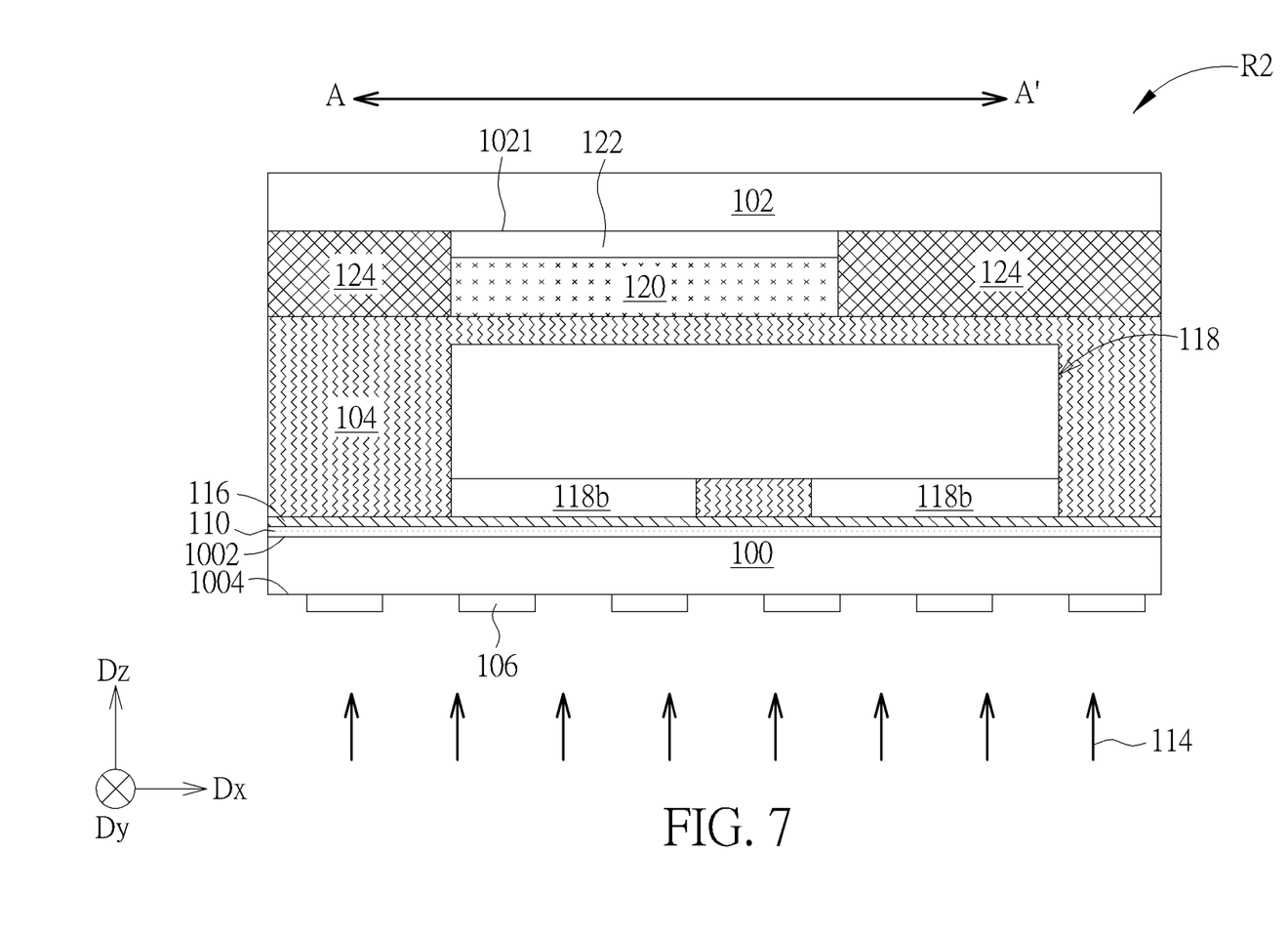
FIG. 7 schematically illustrates a cross-sectional view of an electronic device according to a second embodiment of the present disclosure.

Referring to FIG. 7, FIG. 7 schematically illustrates a cross-sectional view of an electronic device according to a second embodiment of the present disclosure. The difference between the second embodiment and the first embodiment (shown in FIG. 6) is that the wavelength selection layer 110 of the second embodiment may be disposed on the surface 1002 of the substrate 100 or disposed between the light emitting element 118 and the substrate 100, but not limited thereto.

Figure 8:
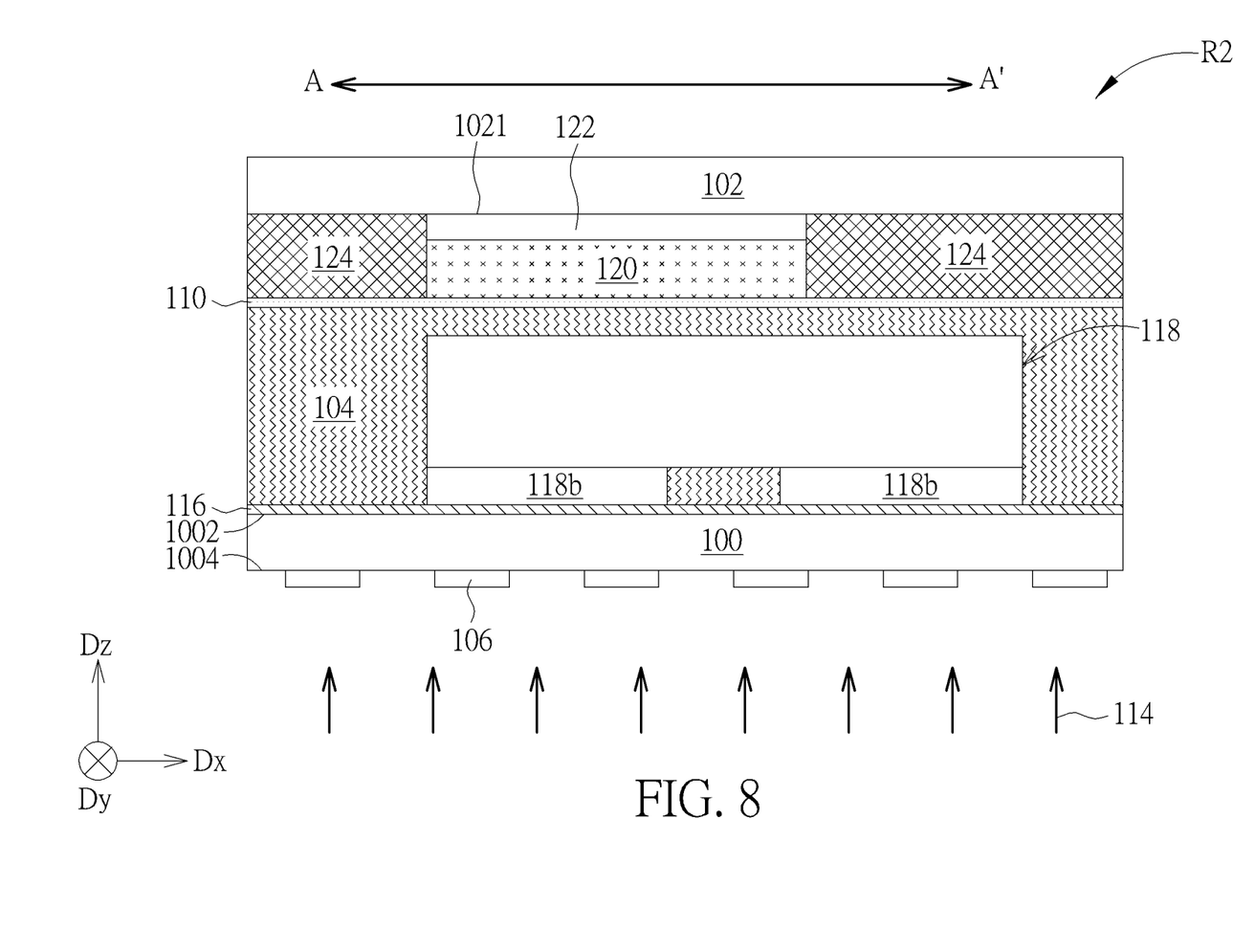
FIG. 8 schematically illustrates a cross-sectional view of an electronic device according to a third embodiment of the present disclosure.

Referring to FIG. 8, FIG. 8 schematically illustrates a cross-sectional view of an electronic device according to a third embodiment of the present disclosure. The difference between the third embodiment and the first embodiment (shown in FIG. 6) is that the wavelength selection layer 110 of the third embodiment may be disposed between the light emitting element 118 and the substrate 102 or disposed between the adhesive layer 104 and the wavelength conversion layer 120, but not limited thereto. The wavelength selection layer 110, the wavelength conversion layer 120, the color filter 122 and the black matrix layer 124 may be disposed on the substrate 102, and may be bonded to the substrate 100 through the adhesive layer 104, but not limited thereto. Because the wavelength selection layer 110 of the present embodiment is disposed on a side of the light emitting element 118 where the light emitting element 118 emits the light, the material of the wavelength selection layer 110 may be a material that does not block the light emitted by the light emitting element 118. For example, the wavelength range of the light that can be blocked by the wavelength selection layer 110 does not include the wavelength of the light emitted by the light emitting element 118.

Figure 9:
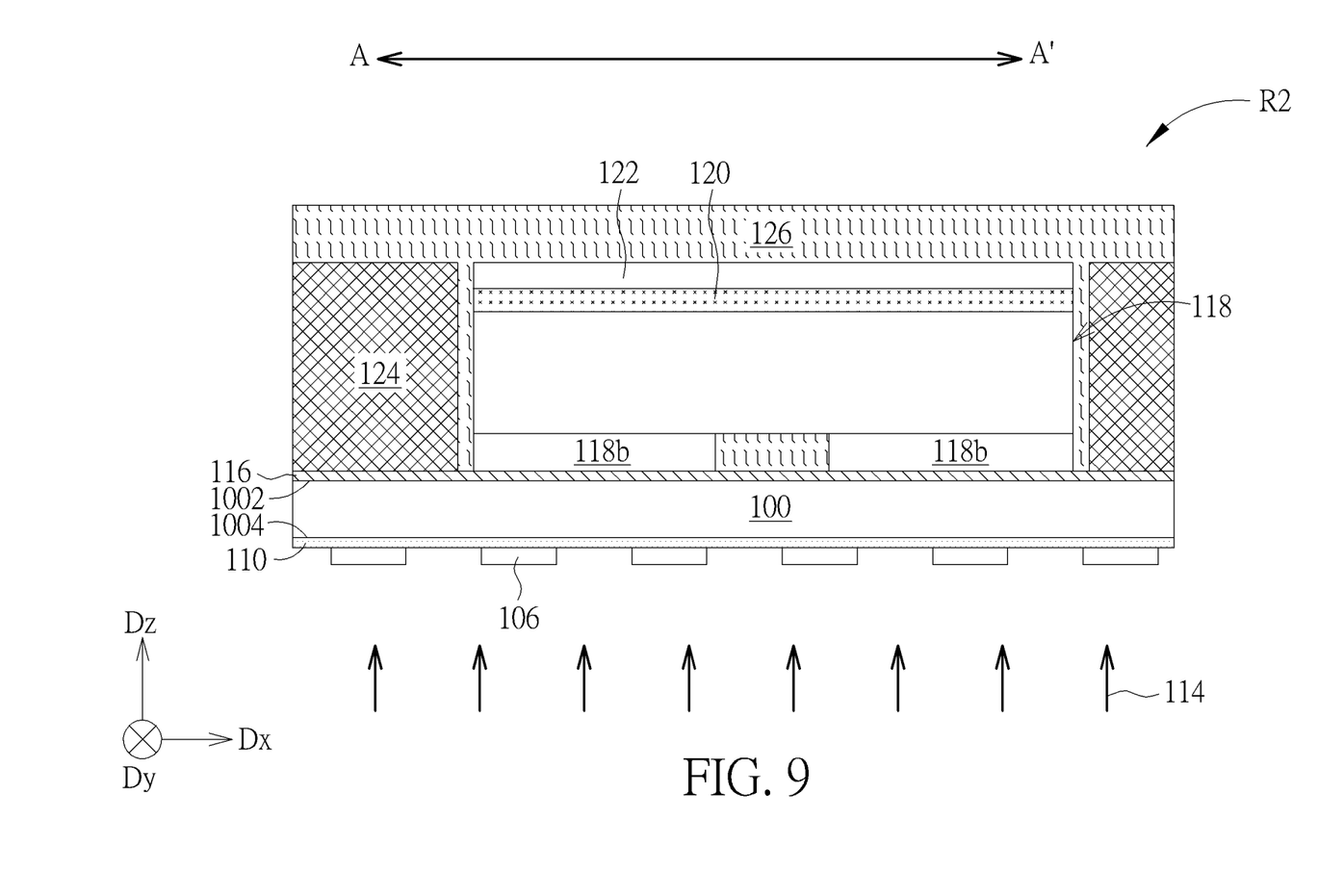
FIG. 9 schematically illustrates a cross-sectional view of an electronic device according to a fourth embodiment of the present disclosure.

In some embodiments, the wavelength conversion layer 120 may at least cover the light emitting region in the upper surface of the light emitting element 118, and the area of the light emitting region may be slightly less than the area of the upper surface of the light emitting element 118 in the direction Dz, but not limited thereto. In some embodiments, the wavelength conversion layer 120 may at least cover the upper surface of the light emitting element 118 in the direction Dz. As shown in FIG. 9, the above-mentioned embodiment that the wavelength conversion layer 120 covers the light emitting element 118 may be applied to other embodiments of the present disclosure, and will not be redundantly described.

In some embodiments, the covering area of the color filter 122 may be equal to the area of the upper surface of the wavelength conversion layer 120 in the direction Dz. In some embodiments, the covering area of the color filter 122 may be greater than the area of the upper surface of the wavelength conversion layer 120.

Referring to FIG. 9, FIG. 9 schematically illustrates a cross-sectional view of an electronic device according to a fourth embodiment of the present disclosure. The difference between the fourth embodiment and the first embodiment (shown in FIG. 6) is that the electronic device 10 of the fourth embodiment may include an encapsulation layer 126 and not include the substrate 102 and the adhesive layer 104 in the first embodiment, but not limited thereto. The encapsulation layer 126 may be disposed on the light emitting element 118, and may cover the color filter 122 and the black matrix layer 124. The color filter 122 may be disposed on the wavelength conversion layer 120, and the color filter 122 and the wavelength conversion layer 120 may be disposed between the encapsulation layer 126 and the light emitting element 118. The black matrix layer 124 may be disposed on the substrate 100, and may be disposed at peripherals of the light emitting element 118, the wavelength conversion layer 120 and/or the color filter 122. The material of the encapsulation layer 126 may be filled into the gap between the black matrix layer 124 and the light emitting element 118 or the gap between the bonding pads 118b to reduce the influence of moisture or oxygen on the light emitting element 118. The encapsulation layer 126 may include a single layer structure or a multi-layers structure, but not limited thereto. The encapsulation layer 126 may include organic insulating materials, inorganic insulating materials or the combinations of the above-mentioned materials, but not limited thereto.

Figure 10:
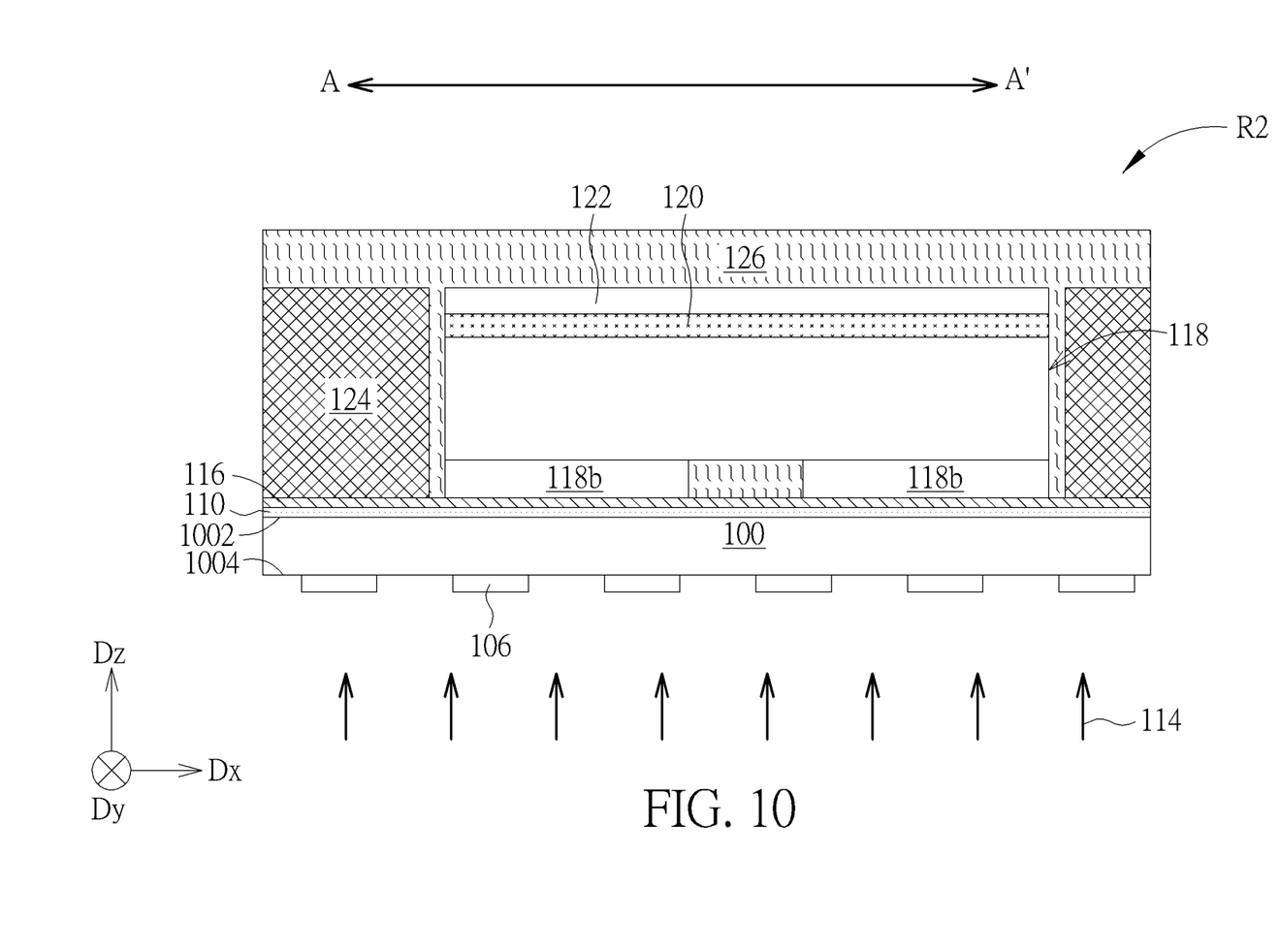
FIG. 10 schematically illustrates a cross-sectional view of an electronic device according to a fifth embodiment of the present disclosure.

Referring to FIG. 10, FIG. 10 schematically illustrates a cross-sectional view of an electronic device according to a fifth embodiment of the present disclosure. The difference between the fifth embodiment and the fourth embodiment (shown in FIG. 9) is that the wavelength selection layer 110 of the fifth embodiment may be disposed on the surface 1002 of the substrate 100 or may be disposed between the light emitting element 118 and the substrate 100, but not limited thereto.

Figure 11:
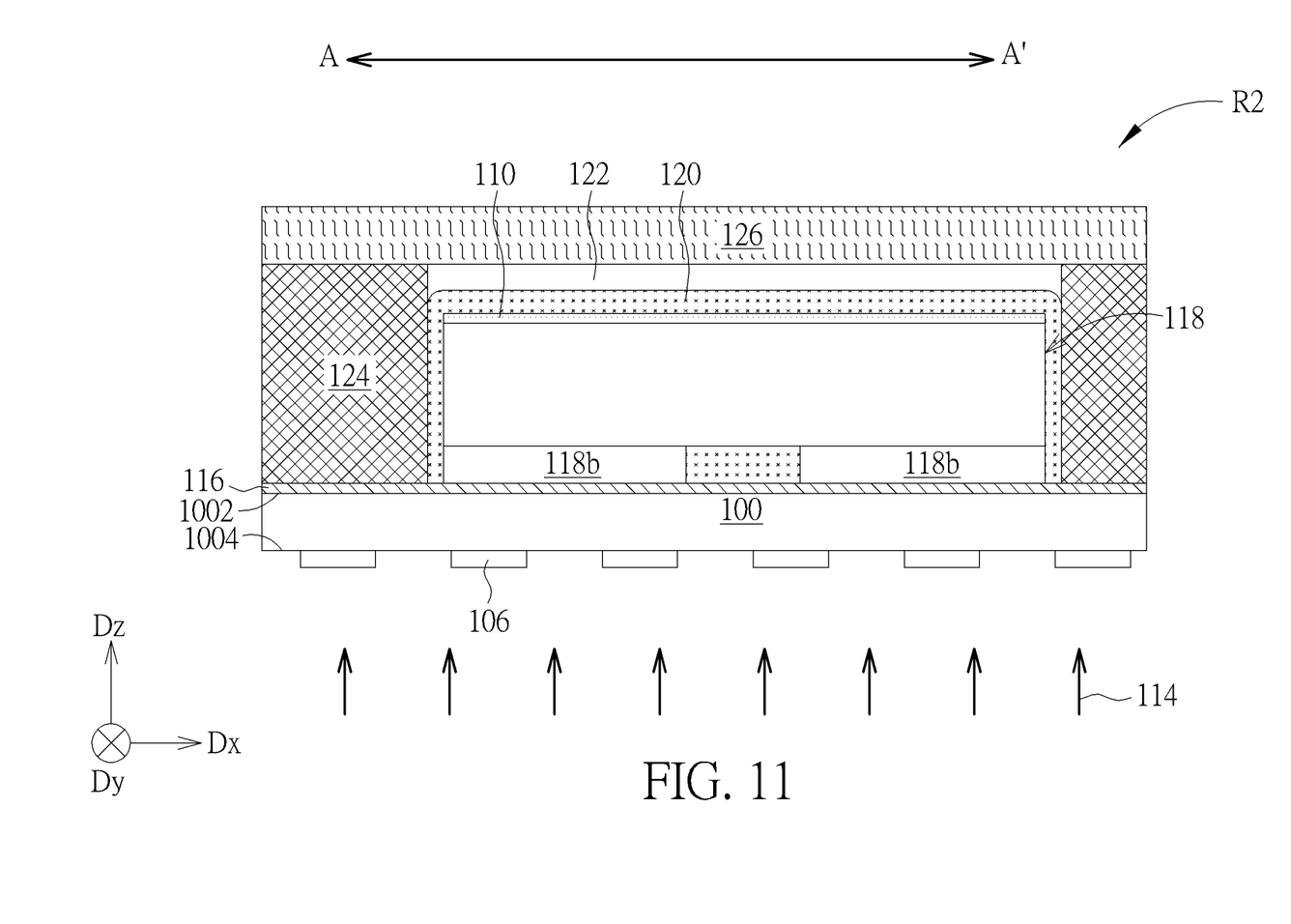
FIG. 11 schematically illustrates a cross-sectional view of an electronic device according to a sixth embodiment of the present disclosure.

Referring to FIG. 11, FIG. 11 schematically illustrates a cross-sectional view of an electronic device according to a sixth embodiment of the present disclosure. The difference between the sixth embodiment and the fourth embodiment (shown in FIG. 9) is that the wavelength selection layer 110 of the sixth embodiment may be disposed on the light emitting element 118 or may be disposed between the light emitting element 118 and the wavelength conversion layer 120, but not limited thereto. The wavelength selection layer 110 may be disposed between the adjacent black matrix layers 124 in the present embodiment, but not limited thereto. Because the wavelength selection layer 110 of the present embodiment is disposed on a side of the light emitting element 118 where the light emitting element 118 emits the light, the material of the wavelength selection layer 110 may be a material that does not block the light emitted by the light emitting element 118.

In some embodiments (as shown in FIG. 11), in the direction Dz, the wavelength conversion layer 120 may cover the upper surface of the light emitting element 118, and the wavelength conversion layer 120 may be disposed in the gap between the side of the light emitting element 118 and the black matrix layer 124. In some embodiments, the wavelength conversion layer 120 may be optionally filled into the gap between the bonding pads 118b. The gap between the bonding pads 118b may be filled with other materials, and the materials may for example include glue or photoresist polymer materials such as acrylic resin, epoxy resin, phenolic resin, etc., but not limited thereto.

In some embodiments, the electronic devices in the second embodiment (shown in FIG. 7) to the sixth embodiment (shown in FIG. 11) may include the structure of the first example or the second example of the region R1 close to the edge of the electronic device 10 in the first embodiment.

In summary, the wavelength selection layer may be disposed between the conductive wire and the wavelength conversion layer in the electronic device of the present disclosure. When the conductive wire is cured by the energy beam, the wavelength selection layer may be used to block the energy beam to protect the material in the wavelength conversion layer or to reduce the deterioration of the components or materials of the electronic device affected by the energy beam by disposing the wavelength selection layer between the conductive wire and the wavelength conversion layer, thereby improving reliability or display quality of the electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a first substrate having a first surface, a second surface and a first side surface, wherein the second surface is opposite to the first surface, the first side surface is located between the first surface and the second surface, and the first side surface connects the first surface and the second surface;
a light emitting element disposed on the first surface and configured to emit a light;
a wavelength conversion layer disposed on the light emitting element and configured to convert the light;
a conductive wire electrically connected to the light emitting element; and
an adhesive layer disposed on the first surface and the light emitting element, wherein the adhesive layer has a second side surface, a first portion of the conductive wire is disposed on the first side surface of the first substrate and the second side surface of the adhesive layer.

2. The electronic device of claim 1, wherein a second portion of the conductive wire is disposed on the second surface.

3. The electronic device of claim 1, further comprising a wavelength selection layer disposed between the conductive wire and the wavelength conversion layer, wherein the wavelength selection layer is disposed between the conductive wire and the first substrate.

4. The electronic device of claim 1, further comprising a wavelength selection layer disposed between the conductive wire and the wavelength conversion layer, wherein the wavelength selection layer is disposed between the light emitting element and the first substrate.

5. The electronic device of claim 1, further comprising a wavelength selection layer disposed between the conductive wire and the wavelength conversion layer, wherein the wavelength selection layer is disposed on the light emitting element.

6. The electronic device of claim 1, further comprising a wavelength selection layer and a second substrate, wherein the wavelength selection layer is disposed between the conductive wire and the wavelength conversion layer, the second substrate is disposed opposite to the first substrate, and the wavelength conversion layer and the wavelength selection layer are disposed on the second substrate.

7. The electronic device of claim 2, wherein the conductive wire is disposed on the second surface and the first side surface of the first substrate through a printing process.

8. The electronic device of claim 1, further comprising a second substrate, wherein the adhesive layer is disposed between the first substrate and the second substrate.

9. The electronic device of claim 1, wherein the adhesive layer comprises optical clear resin.

10. The electronic device of claim 1, wherein the light emitting element is covered by the adhesive layer.

11. The electronic device of claim 1, further comprising a circuit layer disposed on the first surface of the first substrate, wherein the circuit layer is electrically connected to a bonding pad of the light emitting element.

12. The electronic device of claim 1, further comprising a wavelength selection layer disposed between the conductive wire and the wavelength conversion layer, wherein the wavelength selection layer comprises multiple layers having at least two different refractive indices.

13. The electronic device of claim 1, further comprising a wavelength selection layer disposed between the conductive wire and the wavelength conversion layer, wherein the wavelength selection layer comprises a material selected from a group consisting of silver, gold, copper, aluminum, chromium, platinum, and a combination thereof.

14. The electronic device of claim 1, further comprising an encapsulation layer disposed on the light emitting element, wherein the wavelength conversion layer is disposed between the encapsulation layer and the light emitting element.

15. The electronic device of claim 1, wherein the wavelength conversion layer comprises quantum dot material, phosphor material or fluorescence material.

16. The electronic device of claim 1, wherein the conductive wire comprises conductive glue.

17. The electronic device of claim 1, further comprising a wavelength selection layer disposed between the conductive wire and the wavelength conversion layer, wherein the wavelength selection layer comprises an infrared light absorber.

18. The electronic device of claim 1, further comprising a color filter disposed on the wavelength conversion layer.

* * * * *